United States Patent
Bolognia

(10) Patent No.: US 8,008,753 B1
(45) Date of Patent: Aug. 30, 2011

(54) SYSTEM AND METHOD TO REDUCE SHORTING OF RADIO FREQUENCY (RF) SHIELDING

(75) Inventor: David Bolognia, Scottsdale, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 129 days.

(21) Appl. No.: 12/107,478

(22) Filed: Apr. 22, 2008

(51) Int. Cl.
*H01L 21/4763* (2006.01)
*H01L 23/552* (2006.01)

(52) U.S. Cl. ............ 257/659; 257/728; 257/E23.114; 361/800; 361/816; 361/818

(58) Field of Classification Search .......... 257/659, 257/728, E23.114; 361/800, 816, 818
See application file for complete search history.

(56) References Cited

U.S. PATENT DOCUMENTS

| | | |
|---|---|---|
| 4,925,024 A | 5/1990 | Ellenberger et al. |
| 5,166,772 A | 11/1992 | Soldner et al. |
| 5,311,059 A * | 5/1994 | Banerji et al. ............. 257/778 |
| 5,394,304 A * | 2/1995 | Jones ......................... 361/765 |
| 5,416,358 A | 5/1995 | Ochi et al. |
| 5,468,999 A | 11/1995 | Lin et al. |
| 5,473,191 A | 12/1995 | Tanaka |
| 5,557,142 A | 9/1996 | Gilmore et al. |
| 5,614,694 A | 3/1997 | Gorenz, Jr. et al. |
| 5,639,989 A * | 6/1997 | Higgins, III ............... 174/386 |
| 5,656,864 A | 8/1997 | Mitsue et al. |
| 5,694,300 A | 12/1997 | Mattei et al. |
| 5,907,271 A | 5/1999 | Hirano et al. |
| 5,940,271 A | 8/1999 | Mertol |
| 6,136,131 A | 10/2000 | Sosnowski |
| 6,194,655 B1 | 2/2001 | Lange, Sr. et al. |
| 6,246,115 B1 | 6/2001 | Tang et al. |
| 6,423,570 B1 | 7/2002 | Ma et al. |
| 6,433,420 B1 | 8/2002 | Yang et al. |
| 6,465,280 B1 | 10/2002 | Martin et al. |
| 6,492,194 B1 * | 12/2002 | Bureau et al. ............... 438/106 |
| 6,602,737 B2 | 8/2003 | Wu |
| 6,686,649 B1 | 2/2004 | Mathews et al. |
| 6,694,610 B1 * | 2/2004 | Kitade .......................... 29/840 |
| 7,030,469 B2 | 4/2006 | Mahadevan et al. |
| 2002/0089832 A1 | 7/2002 | Huang |
| 2003/0067757 A1 | 4/2003 | Richardson et al. |
| 2004/0020673 A1 * | 2/2004 | Mazurkiewicz ........... 174/35 R |
| 2004/0178500 A1 * | 9/2004 | Usui ........................... 257/734 |
| 2004/0232452 A1 * | 11/2004 | Tsuneoka et al. .......... 257/222 |
| 2005/0016768 A1 * | 1/2005 | Zollo et al. ................. 174/262 |
| 2005/0039935 A1 * | 2/2005 | Kolb et al. ................ 174/35 R |
| 2005/0280139 A1 | 12/2005 | Zhao et al. |
| 2006/0266547 A1 * | 11/2006 | Koga .......................... 174/255 |
| 2007/0030661 A1 | 2/2007 | Morris et al. |
| 2007/0052076 A1 * | 3/2007 | Ramos et al. .............. 257/676 |
| 2008/0265421 A1 * | 10/2008 | Brunnbauer et al. ....... 257/758 |

* cited by examiner

*Primary Examiner* — Eugene Lee
*Assistant Examiner* — Peniel M Gumedzoe
(74) *Attorney, Agent, or Firm* — Weiss & Moy, P.C.; Jeffrey D. Moy

(57) ABSTRACT

An integrated circuit module has a substrate having a plurality of metal traces. At least one semiconductor package is electrically coupled to at least one metal trace on a first surface of the substrate. At least one electronic component is electrically coupled to at least one metal trace on the first surface of the substrate. A non-conductive coating covers exposed active surfaces on the first surface of the substrate. A conductive coating is applied to the non-conductive coating, and electrically contacting ground pads exposed on the substrate.

15 Claims, 4 Drawing Sheets

SYSTEM AND METHOD TO REDUCE SHORTING OF RADIO FREQUENCY (RF) SHIELDING

FIELD OF THE INVENTION

This invention relates to Radio Frequency (RF) shielding and, more specifically, to a system and method that allows RF shielding to be applied to integrated circuit (IC) devices and modules that reduces the potential of the RF shielding to short to other components or be affected by Electro-static Discharge (ESD).

BACKGROUND OF THE INVENTION

Radio Frequency (RF) shielding is required on certain semiconductor devices and modules (hereinafter semiconductor device) in order to minimize Electro-Magnetic Interference (EMI) radiation from the semiconductor device. RF shielding is further required to prevent RF radiation from external sources from interfering with operation of the semiconductor device.

RF shielding is generally accomplished in one of three ways. A first method is to attach a metal can over the component after the component is attached to the motherboard. However, shield attach on the mother board has several problems. First, shield attach can be costly and a low yielding process. External shields soldered to the motherboard further require additional board space.

An alternative to the shield attached method described above is an embedded RF shield. In an embedded shield, the metal RF shield is directly attached to the semiconductor package substrate by means of solder or a conductive adhesive. The shield may be fully embedded within the mold compound of the finished package or can be exposed after assembly. In either case, the addition of a metal shield as a component attached to the top surface of the substrate is problematic for several reasons. First, the addition of a metal shield as a component attached to the top surface of the substrate requires a significant amount of additional space on the package substrate. Second, it can be difficult to transfer mold in and around the metal shield to fully encapsulate the semiconductor package. Shield attach is also problematic due to flux creep during shield attach which may cause delamination and extrusion issues.

The third method is the conventional conformal shield. Conformal shielding is the latest technology to support integrated circuit (IC) devices and System in a Package (SiP) modules shielding. The conformal shielding creates a metallic coating, which is attached to ground metal in the substrate to provide a full shielding result. Presently, the conductive coating is applied to non-conductive surfaces, i.e., mold compound, substrate, etc. The conductive coating can not be applied to exposed metal on the substrate, packages, and passive components as shorting will occur.

Therefore, a need existed to provide a system and method to overcome the above problem. The system and method would provide for RF shielding for exposed die components, non-encapsulated modules or motherboards.

SUMMARY OF THE INVENTION

An integrated circuit module has a substrate having a plurality of metal traces. At least one semiconductor package is electrically coupled to at least one metal trace on a first surface of the substrate. At least one electronic component is electrically coupled to at least one metal trace on the first surface of the substrate. A non-conductive coating covers exposed active surfaces on the first surface of the substrate. A conductive coating is applied to the non-conductive coating, and electrically contacting ground pads exposed on the substrate.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
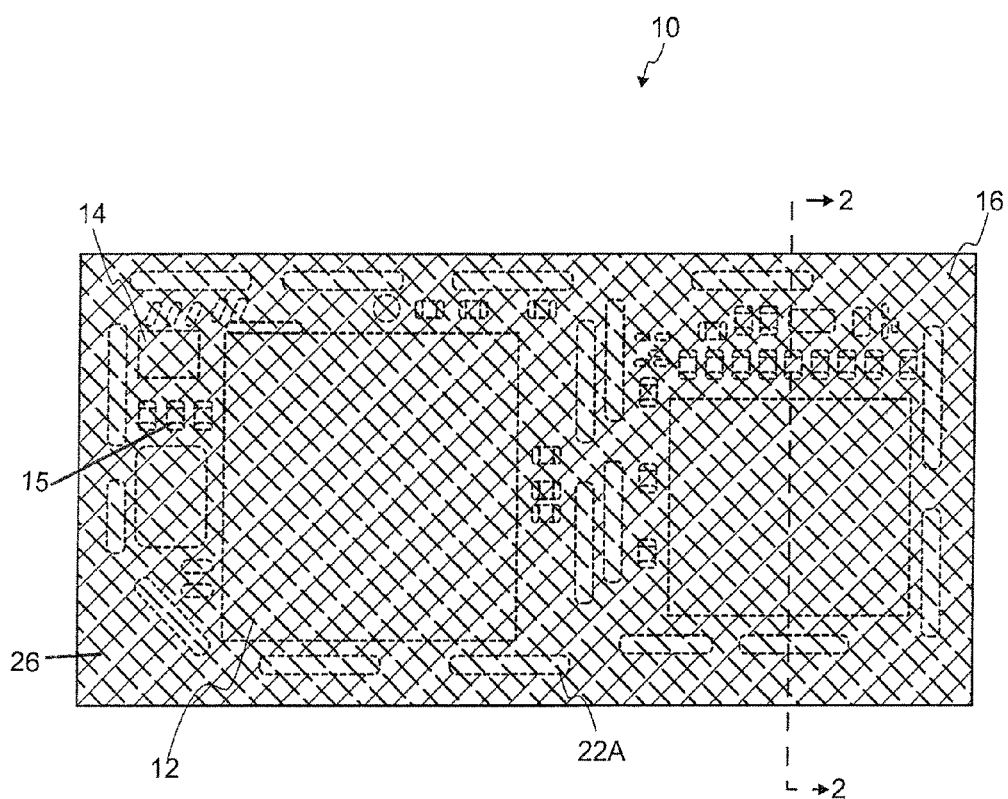
FIG. 1 is a top view of an integrated circuit modules that reduces the potential of the RF shielding to short to other components or be affected by ESD.
Figure 2:
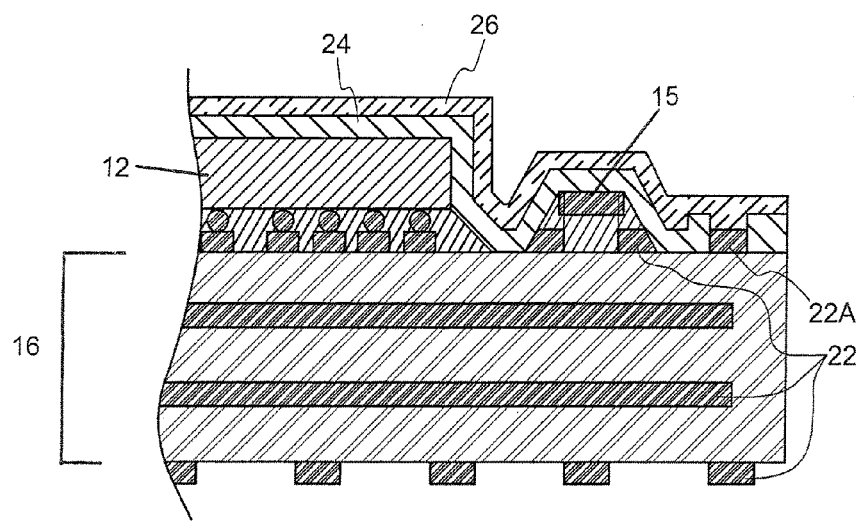
FIG. 2 is a side view of one embodiment of the integrated circuit module of FIG. 1.

Referring to FIGS. 1 and 2, an integrated circuit module 10 (hereinafter module 10) is shown. The module 10 will have at least one electronic component. The electronic component may be prepackaged semiconductor device 12, bare semiconductor die 14, or passive component 15. The prepackaged semiconductor device 12 may be a memory device, a logic device, an ASIC device, and other like elements. The prepackaged semiconductor device 12 may also be a multi-chip module. It should be noted that the listing of the above types of prepackaged semiconductor device 12 is given as an example and should not be seen as to limit the scope of the present invention. The bare semiconductor die 14 may be a memory die, a logic die, an ASIC die, and other like elements. It should be noted that the listing of the above types of bare semiconductor die 14 is given as an example and should not be seen as to limit the scope of the present invention. The passive component 15 may be any type of passive electronic component. The passive component 15 may be packaged singly such as a resistor, capacitor, transistor, diode, and the like. The listing of the above is given as an example and should not be seen as to limit the scope of the present invention.

The prepackaged semiconductor device 12, the bare semiconductor die 14, or the passive components 15 are placed on the first surface of a substrate 16. The substrate 16 may be any one chosen from a conventional rigid PCB, a flexible PCB, a ceramic and an equivalent thereof, but the kind of substrate 16 is not limited herein. The substrate 16 generally includes an insulation layer having predetermined area and thickness. The insulation layer has an approximately planar first surface and an approximately planar second surface opposing the first surface. The substrate 16 has a plurality of metal traces 22 formed on the first surface of the insulation layer 20. A plurality of metal traces 22 may also be formed on the second surface of the insulation layer 20. The substrate 16 may have a plurality of metal trace 22 layers. If multiple layers of metal traces 22 are formed, a dielectric layer is generally applied between the metal layers 22. The dielectric layer is used an insulating layer to separate two metal layers. A solder mask is generally placed over the top surface of the metal traces 22 formed on the substrate 16. The solder mask is used to protect the metal traces 22.

The prepackaged semiconductor device 12, the bare semiconductor die 14, or the passive component 15 are placed on the first surface of the substrate 16. An underfill may be used depending on the type of prepackaged semiconductor device 12 that is placed on the first surface of the substrate 16. The prepackaged semiconductor device 12, the bare semiconductor die 14, or the passive component 15 are then electrically coupled to at least one metal trace 22 on the substrate 16. Different methods may be used to electrically couple the prepackaged semiconductor device 12, the bare semiconductor die 14, or the passive component 15 to the substrate 16. Wirebonds, surface mount technology, through hole technology, flip chip technology, and the like may be used. The listing of the above is given as an example. Other technology may be used to electrically couple the prepackaged semiconductor device 12, the bare semiconductor die 14, or the passive component 15 to the substrate 16 without departing from the spirit and scope of the invention.

In the embodiment shown in FIGS. 1 and 2, a set of metal traces 22A are exposed on the first surface of the substrate 16. The metal traces 22A are used to act as a ground pads for a Radio Frequency (RF) shield. In the embodiment shown in FIGS. 1 and 2, two sets of metal traces 22A are formed. The metal traces 22A are formed around a perimeter of both prepackaged semiconductor devices 12 and a set of electronic components 14. However, this embodiment is shown as one example and should not be seen as to limit the scope of the present invention. The metal traces 22A are formed around a perimeter area of where the RF shield will be positioned.

In accordance with one embodiment of the present invention, a non-conductive coating 24 is applied to the module 10. The non-conductive coating 24 is used to cover any exposed metal areas on the module 10. The non-conductive coating 24 covers the exposed metal areas on the module 10 to prevent shorting and improve Electro-Static Discharge (ESD) when a Radio Frequency (RF) shielding is applied to the module 10. Thus, areas such as the metal traces 22, the metal traces 22A, exposed interconnects of the prepackaged semiconductor devices 12, the bare semiconductor die 14, or the passive component 15, and the like will be covered by the non-conductive coating 24.

In accordance with another embodiment of the present invention, a masking layer such as a photoresist is first applied to the metal traces 22A that are to be used as ground metal pads for the RF shield. The non-conductive coating 24 is then applied to the module 10. The non-conductive coating 24 is used to cover the masking layer and any exposed metal areas on the module 10. Thus, the metal traces 22, exposed interconnects of the prepackaged semiconductor devices 12, the bare semiconductor die 14, or the passive component 15, and the like will be covered by the non-conductive coating 24.

The non-conductive coating 24 may be applied in several different manners. For example, the non-conductive coating 24 may be applied to the entire surface of the module 10. Thus, in the first embodiment, all exposed active metal areas as well as all other areas on the surface of the module 10 would be covered. In the second embodiment which uses a masking layer, the masking layer, all exposed active metal areas as well as all other areas on the surface of the module 10 would be covered. Alternatively, the non-conductive coating 24 may be applied just to the exposed metal areas on the module 10. The non-conductive coating 24 may be applied by a spray or other coating process.

In order to apply an RF shield to the module 10, the set of metal traces 22A need to be exposed on the first surface of the substrate 16. The metal traces 22A are used to act as ground metal pads for the RF shield. If the metal traces 22A are covered by the non-conductive coating 24, then the non-conductive coating 24 will need to be removed. In accordance with one embodiment, the metal traces 22A may be exposed through a laser removal process wherein a laser is used to remove the non-conductive coating 24 from the metal traces 22A. In accordance with the second embodiment, the metal traces 22A are exposed by removing the masking layer. The masking layer is peeled away thereby exposing the metal traces 22A.

Figure 2A:
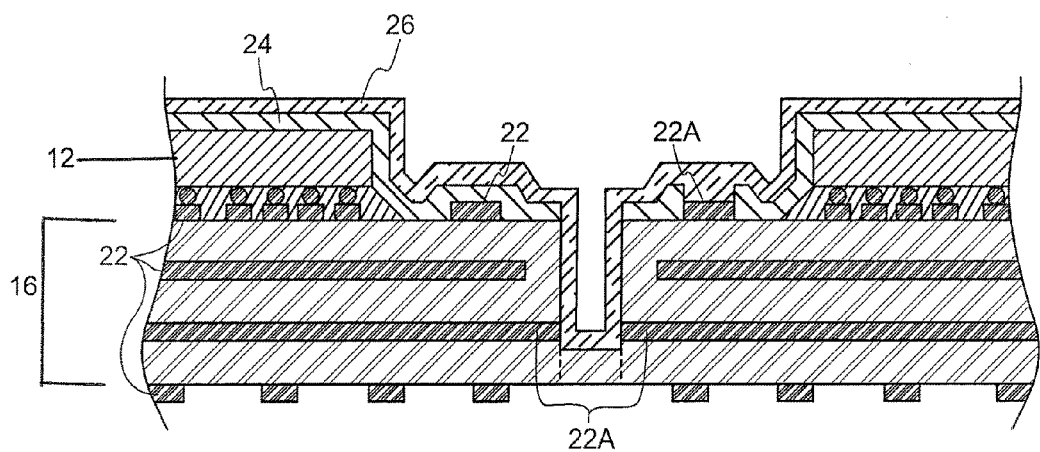
FIG. 2A is a side view of another embodiment of the integrated circuit module of FIG. 1.

Alternatively, as shown in FIG. 2A, the ground plane for the RF shield is embedded in the substrate 16. In this embodiment, one or more of the metal traces 22 in the substrate 16 is used as the ground plane for the RF shield. A partial or full (as shown in dotted lines) saw cut process can be done to the substrate 16 to expose a portion of one or more of the metal traces 22. The exposed metal traces 22 are then used as the ground plane for the RF shield. As shown in FIG. 2A, the metal traces 22A may provide further grounding. The metal traces 22A would be exposed as disclosed above. The above processes are given as examples of exposing metal traces to be used as ground planes. Other techniques may be used without departing from the spirit and scope of the present invention.

A conductive material 26 is then applied to the module 10. The conductive material 26 is used to provide Electro-Magnetic Interference (EMI) radiation and Radio Frequency (RF) radiation shielding for the module 10. The conductive material may be applied to the entire module 10 to provide perimeter RF shielding for the module 10. Alternatively, as shown in FIG. 1, the conductive material 26 may be applied to sections of the module 10 to provide compartmental RF shielding of the module 10. The conductive material 26 may be applied by plating, vacuum printing, vacuum deposition, insert molding, spray coating, and the like.

If the non-conductive coating 24 is applied just to active metal areas on the module 10, the conductive material 26 will cover the non-conductive coating 24, exterior surfaces of the prepackaged semiconductor devices 12, the bare semiconductor die 14, or the passive component 15, and be in contact with the exposed metal traces 22A. Thus, the module 10 will have a conductive material 26 that contacts grounded metal pads formed by the metal traces 22A. Or alternatively, as shown in FIG. 2A, the module 10 will have a conductive material 26 that contacts a ground plane formed by the exposed metal traces 22 exposed by the partial or full saw cut.

If the non-conductive coating 24 is applied to the entire surface of the module 10, the conductive material 26 is applied to the non-conductive coating 24. The conductive material 26 will cover the non-conductive coating 24 and be in contact with the exposed metal traces 22A or the exposed metal traces 22 exposed by the partial or full saw cut (FIG. 2A).

Figure 3:
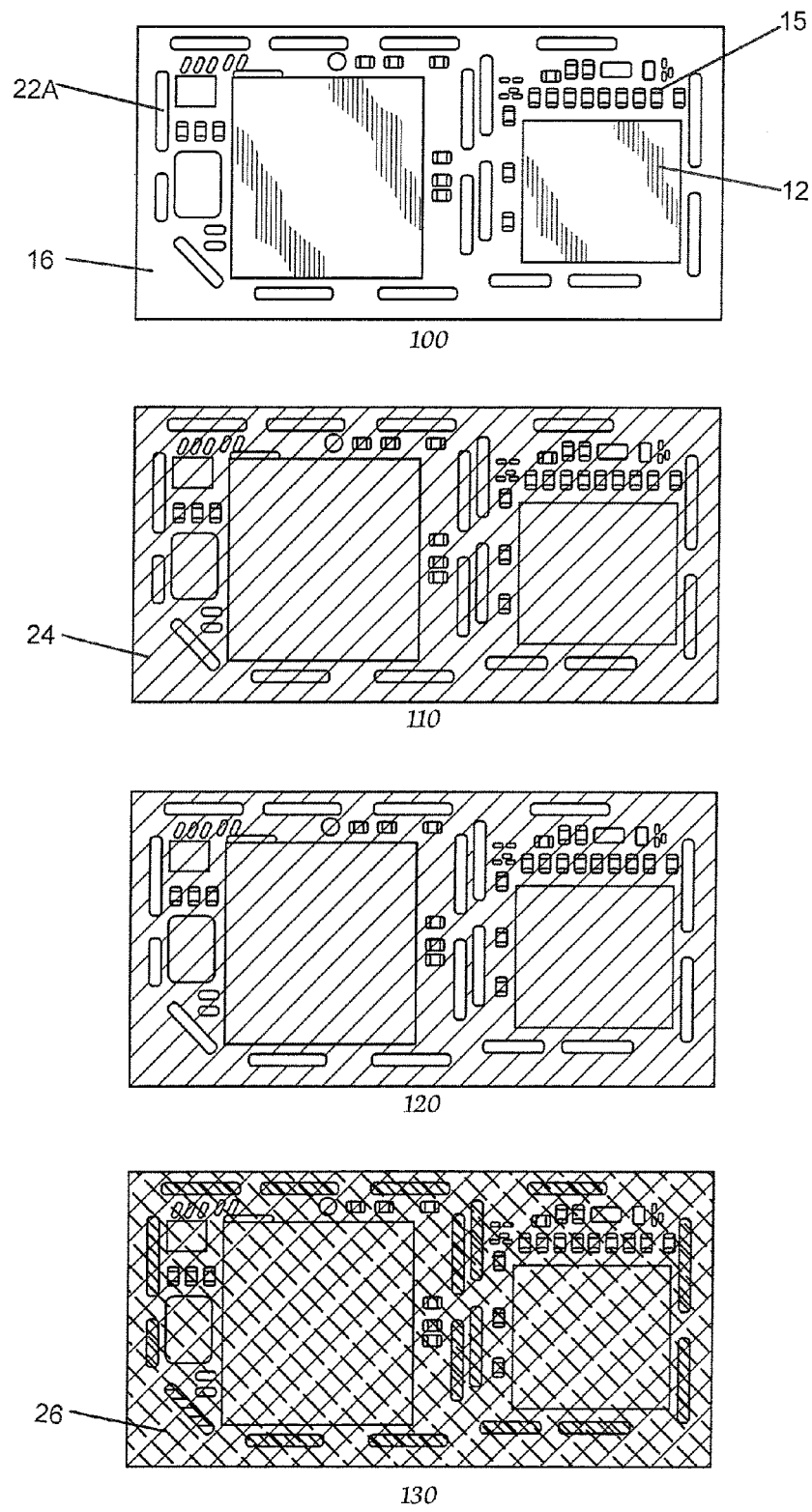
FIG. 3 shows a system and method that allows RF shielding to be applied to IC devices and integrated modules that reduces the potential of the RF shielding to short to other components or be affected by ESD.
Figure 4:
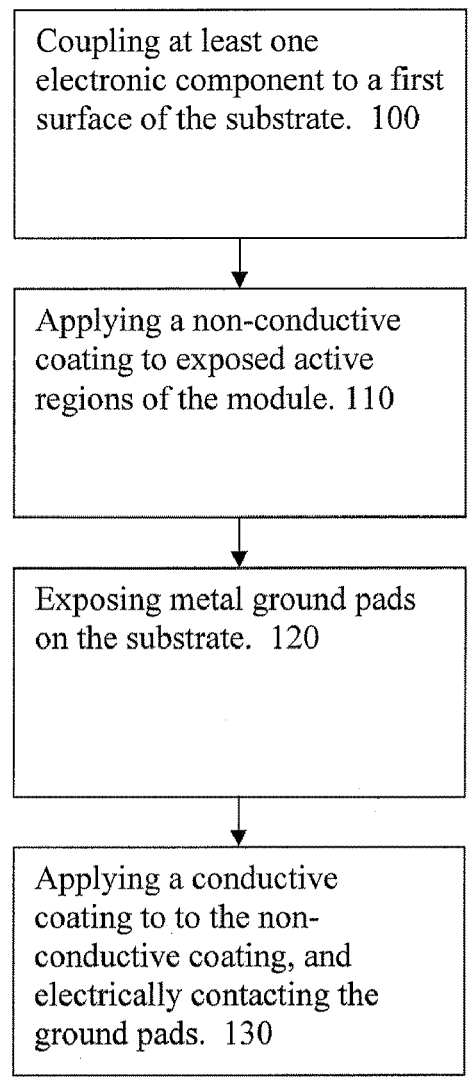
FIG. 4 is a process flow diagram depicting the method of FIG. 3.

Referring now to FIGS. 3 and 4, a method of forming the module 10 is shown. The module 10 will have one or more prepackaged semiconductor devices 12, bare semiconductor die 14, or passive component 15. The prepackaged semiconductor device 12 may be a memory device, a logic device, an ASIC device, and other like elements. The prepackaged semiconductor device 12 may also be a multi-chip module. As shown in Step 100, the prepackaged semiconductor device 12, bare semiconductor die 14, or passive component 15 are placed on the first surface of the substrate 16. The substrate 16 may be any one chosen from a conventional rigid PCB, a flexible PCB, a ceramic and an equivalent thereof, but the kind of substrate 16 is not limited herein. The prepackaged semiconductor device 12 and the one or more electronic components 14 are placed on the first surface of the substrate 16. An underfill may be used depending on the type of prepackaged semiconductor device 14. The prepackaged semiconductor device 12, bare semiconductor die 14, or passive component 15 is then electrically coupled to at least one metal trace 22 on the substrate 16. Different methods may be used to electrically couple the prepackaged semiconductor device 12, bare semiconductor die 14, or passive component 15 to the substrate 16. Wirebonds, surface mount technology, through hole technology, flip chip technology, and the like may be used. The listing of the above is given as an example. Other technology may be used to electrically couple the prepackaged semiconductor device 12, bare semiconductor die 14, or passive component 15 to the substrate 16 without departing from the spirit and scope of the invention.

After the prepackaged semiconductor device 12, bare semiconductor die 14, or passive component 15 are electrically coupled to the metal traces 22 of the substrate 16, a non-conductive coating 24 is applied to the module 10 as shown in Step 110. The non-conductive coating 24 is used to cover any exposed metal areas on the module 10. The non-conductive coating 24 covers the exposed metal areas on the module 10 to prevent shorting and improve Electro-Static Discharge (ESD) when a Radio Frequency (RF) shielding is applied to the module 10. The non-conductive coating 24 may be applied in several different manners. For example, the non-conductive coating 24 may be applied to the entire surface of the module 10 thereby covering all exposed active areas. Alternatively, the non-conductive coating 24 may be applied just to the exposed metal areas on the module 10. The non-conductive coating 24 may be applied by a spray or other coating process.

Alternatively, a masking layer such as a photoresist may be first applied to the metal traces 22A that are to be used as ground metal pads for the RF shield. The non-conductive coating 24 is then applied to the module 10 as disclosed above. The non-conductive coating 24 is used to cover the masking layer and any exposed metal areas on the module 10. Thus, the metal traces 22, exposed interconnects of the prepackaged semiconductor devices 12, and the electronic components 14, and the like will be covered by the non-conductive coating 24.

As shown in Step 120, the set of metal traces 22A or the embedded metal traces 22 needs to be exposed. The exposed metal traces 22 or 22A will act as ground metal pads for the RF shield. In accordance with one embodiment, if the metal traces 22A are covered by the non-conductive coating 24, then the non-conductive coating 24 will need to be removed. The metal traces 22A may be exposed using a laser removal process to remove the non-conductive coating 24 from the metal traces 22A. Alternatively, if a masking layer was applied, the metal traces 22A are exposed by removing the masking layer. The masking layer is peeled away thereby exposing the metal traces 22A.

In accordance with another embodiment of the present invention, if one or more of the metal traces 22 in the substrate 16 is used as the ground plane for the RF shield, a partial or full (as shown in dotted lines) saw cut process can be done to expose a portion of one or more of the metal traces 22. The exposed metal traces 22 are then used as the ground plane for the RF shield. The metal traces 22A may provide further grounding. The metal traces 22A would be exposed as disclosed above. Other methods may be used without departing from the spirit and scope of the present invention.

A conductive material 26 is then applied to the module 10 as shown in step 130. The conductive material 26 is used to provide RF shielding for the module 10. The conductive material may be applied to the entire module 10 to provide perimeter RF shielding for the module 10. Alternatively, the conductive material 26 may be applied to sections of the module 10 to provide compartmental RF shielding of the module 10. The conductive material 26 may be applied by plating, vacuum printing, vacuum deposition, insert molding, spray coating, and the like.

If the non-conductive coating 24 is applied just to active metal areas on the module 10, the conductive material 26 will cover the non-conductive coating 24, exterior surfaces of the prepackaged semiconductor devices 12 and the electronic components 14, and be in contact with the exposed metal traces 22A. Thus, the module 10 will have a conductive material 26 that contacts grounded metal pads formed by the metal traces 22A. Or alternatively, as shown in FIG. 2A, the module 10 will have a conductive material 26 that contacts a ground plane formed by the exposed metal traces 22 exposed by the partial or full saw cut.

If the non-conductive coating 24 is applied to the entire surface of the module 10, the conductive material 26 is applied to the non-conductive coating 24. The conductive material 26 will cover the non-conductive coating 24 and be in contact with the exposed metal traces 22A or the exposed metal traces 22 exposed by the partial or full saw cut (FIG. 2A).

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. An integrated circuit module comprising:
   a substrate having a plurality of metal traces;
   at least one electronic component electrically coupled to at least one metal trace on a first surface of the substrate;
   a non-conductive coating covering a top surface of the module, the non-conductive coating covering exposed surfaces on the first surface of the substrate and exposed surfaces on the at least one electronic component, wherein the non-conductive coating has an approximately uniform thickness, a top surface of the non-conductive coating being non-planar, the non-conductive coating covering exposed active surfaces to prevent shorting and improve Radio-Frequency (RF) shielding;
   a plurality of openings formed through the non-conductive coating to expose ground pads formed on the first surface of the substrate;
   a conductive coating applied to the non-conductive coating, and electrically contacting the ground pads exposed through the openings formed through the non-conductive coating; and
   ground pads formed by exposed metal layers formed on offset surfaces within the substrate, the conductive coating applied to the non-conductive coating and the exposed metal layers.

2. An integrated circuit module in accordance with claim 1 further comprising a plurality of electronic components, the plurality of electronic components comprising at least one of a prepackaged semiconductor device or a bare semiconductor die and at least one passive component.

3. An integrated circuit module in accordance with claim 2 wherein the ground pads are formed in predefined areas on the first surface of the substrate, the conductive coating applied in the predefined areas and coupled to the ground pads to provide compartmental RF shielding.

4. An integrated circuit module in accordance with claim 2 wherein the ground pads are formed around an outer perimeter of the substrate, the conductive coating coupled to the ground pads to provide perimeter RF shielding.

5. An integrated circuit module in accordance with claim 1 wherein the exposed metal layers are exposed on a vertical member of the offset surfaces below the first surface of the substrate.

6. The integrated circuit module in accordance with claim 1 wherein the non-conductive coating is applied to the first surface of the substrate and covers the exposed active surfaces on the first surface of the module and exterior surfaces of the at least one electronic component.

7. An integrated circuit module comprising:
  a substrate having a plurality of metal traces;
  at least one semiconductor package electrically coupled to at least one metal trace on a first surface of the substrate;
  at least one electronic component electrically coupled to at least one metal trace on the first surface of the substrate;
  means for covering exposed active surfaces on the first surface of the substrate, on the at least one semiconductor package, and on the at least one electronic component, means for covering preventing shorting and improving Radio Frequency (RF) shielding, wherein the means for covering has an approximately uniform thickness, a top surface of the means for covering being non-planar;
  openings formed through the means for covering to expose ground pads formed on the first surface of the substrate;
  means applied to the means for covering and electrically coupled to the ground pads exposed through the means for covering for providing Radio Frequency (RF) shielding; and
  ground pads formed on exposed metal layers formed on offset surfaces within the substrate, the means for providing Radio Frequency (RF) shielding applied to the means for covering exposed active surfaces on the first surface of the substrate and the exposed metal layers.

8. An integrated circuit module in accordance with claim 7 wherein the exposed metal layers are exposed on a vertical member of the offset surfaces below the first surface of the substrate.

9. An integrated circuit module in accordance with claim 7 wherein the means for covering is applied to a first surface of the integrated circuit module and covers the exposed active surfaces on the first surface of the integrated circuit module.

10. A method of manufacturing an integrated circuit module comprising:
  providing a substrate having a plurality of metal traces;
  coupling at least one electronic component electrically to at least one metal trace on a first surface of the substrate;
  applying a non-conductive coating having an approximately uniform thickness and non-planar top surface to cover exposed active surfaces on a first surface of the module to prevent shorting and to improve Radio Frequency (RE) shielding;
  forming openings through the non-conductive coating exposing ground pads formed on the first surface of the substrate; and
  applying a conductive coating to the non-conductive coating, the conductive coating electrically contacting ground pads exposed on the first surface of the substrate to provide RF shielding;
  wherein exposing ground pads further comprises performing a saw cut to the substrate to expose the ground pads.

11. The method of claim 10 further comprising:
  forming the ground pads around predefined areas of the substrate; and
  applying the conductive coating in the predefined areas and coupled to the ground pads to provide compartmental RE shielding.

12. The method of claim 10 further comprising:
  forming the ground pads around an outer perimeter of the substrate; and
  applying the conductive coating coupled to the ground pads to provide perimeter RF shielding.

13. The method of claim 10 wherein applying the conductive coating further comprises applying the conductive coating to the non-conductive coating, exterior surfaces of the at least one electronic component, and electrically contacting ground pads exposed on the substrate.

14. The method of claim 10 wherein applying the non-conductive coating further comprises applying the non-conductive coating to a first surface of the substrate such that the non-conductive coating covers the exposed active surfaces on the first surface of the substrate and the at least one electronic component.

15. The method of claim 10 wherein exposing ground pads further comprises laser removal of the non-conductive coating to expose the ground pads.

* * * * *